(12) United States Patent
Lu et al.

(10) Patent No.: US 10,423,267 B2
(45) Date of Patent: Sep. 24, 2019

(54) CONDUCTIVE THIN FILM, TOUCH PANEL AND METHOD FOR MANUFACTURING THE SAME, AND DISPLAY DEVICE

(71) Applicant: BOE Technology Group Co., Ltd., Beijing (CN)

(72) Inventors: Yongchun Lu, Beijing (CN); Yong Qiao, Beijing (CN); Hongfei Cheng, Beijing (CN); Jianbo Xian, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 125 days.

(21) Appl. No.: 14/771,152

(22) PCT Filed: Oct. 24, 2014

(86) PCT No.: PCT/CN2014/089452
§ 371 (c)(1),
(2) Date: Aug. 27, 2015

(87) PCT Pub. No.: WO2016/019636
PCT Pub. Date: Feb. 11, 2016

(65) Prior Publication Data
US 2016/0364062 A1    Dec. 15, 2016

(30) Foreign Application Priority Data

Aug. 5, 2014    (CN) .......................... 2014 1 0381380

(51) Int. Cl.
*G06F 3/041* (2006.01)
*G06F 3/045* (2006.01)
(Continued)

(52) U.S. Cl.
CPC ............ *G06F 3/0416* (2013.01); *G06F 3/044* (2013.01); *G06F 3/045* (2013.01); *G06F 3/0412* (2013.01);
(Continued)

(58) Field of Classification Search
None
See application file for complete search history.

(56) References Cited

U.S. PATENT DOCUMENTS

2005/0116214 A1* 6/2005 Mammana ............. B82Y 10/00
257/10
2010/0265206 A1* 10/2010 Chen ...................... G06F 3/0412
345/174

(Continued)

FOREIGN PATENT DOCUMENTS

CN    101819482 A    9/2010
CN    102866816 A    1/2013
(Continued)

OTHER PUBLICATIONS

Guo et al. "Selective-area Van der Waals epitaxy of topological insulator grid nanostructures for broadband transparent flexible electrodes." Adv. Mater. 2013, 25, 5959-5964.*
(Continued)

*Primary Examiner* — Joseph R Haley
*Assistant Examiner* — Emily J Frank
(74) *Attorney, Agent, or Firm* — Banner & Witcoff, Ltd.

(57) ABSTRACT

A conductive thin film, a touch panel and a manufacturing method for the same, and a display device are provided. Material for forming the conductive thin film comprise topological insulator, the conductive thin film has a two-dimensional nanostructure, which solves the technical problem that the resistance of electrodes of the touch panel is relatively harge.

15 Claims, 4 Drawing Sheets

(51) Int. Cl.
*G06F 3/044* (2006.01)
*G02F 1/1333* (2006.01)
*G02F 1/1343* (2006.01)
*H01L 27/32* (2006.01)

(52) U.S. Cl.
CPC ...... *G02F 1/13338* (2013.01); *G02F 1/13439* (2013.01); *G02F 1/133345* (2013.01); *G02F 2202/28* (2013.01); *G06F 2203/04103* (2013.01); *G06F 2203/04112* (2013.01); *H01L 27/323* (2013.01)

(56) References Cited

U.S. PATENT DOCUMENTS

| | | | |
|---|---|---|---|
| 2010/0283757 | A1 | 11/2010 | Wu et al. |
| 2010/0328256 | A1* | 12/2010 | Harada ............... G02F 1/13338 345/174 |
| 2013/0189502 | A1* | 7/2013 | Takahashi ............. B29C 59/002 428/195.1 |
| 2014/0202742 | A1* | 7/2014 | Jones .................... B23K 26/18 174/253 |
| 2015/0177867 | A1* | 6/2015 | Chung ................... G06F 3/044 345/174 |
| 2015/0337145 | A1* | 11/2015 | Torrisi ................. C09D 11/037 428/207 |

FOREIGN PATENT DOCUMENTS

| | | |
|---|---|---|
| CN | 103022341 A | 4/2013 |
| CN | 103022344 A | 4/2013 |
| CN | 103413594 A | 11/2013 |

OTHER PUBLICATIONS

Xu et al. "Large-gap quantum spin hall insulators in tin films." Phys. Rev. Let. 111, 136804 (2013).*
Guo et al. "Selective-area Van der Waals epitaxy of topological insulator grid nanostructures for broadband transparent flexible electrodes." Adv. Mater. 2013, 25, 5959-5964 (Year: 2013).*
Xu et al. "Large-gap quantum spin hall insulators in tin films." Phys. Rev. Let. 111, 136804 (2013) (Year: 2013).*
May 4, 2015—International Search Report and Written Opinion Appn PCT/CN2014/089452 with English Tran.
Li Hui, et al., Two-Dimensional Topological Insulator Structures and Devices, Journal of Physics and Chemistry, Oct. 2012, vol. 28, No. 10, pp. 2423-2435.
Aug. 22, 2016—(CN)—First Office Action Appn 201410381380.8 with English Tran.
Li Hui, et al., "Two-Dimensional Nanostructures of Topological Insulators and Their Devices", Acta Physico-Chimina Sinica, vol. 10, Aug. 2012, pp. 2423-2433.
Jan. 17, 2017—(CN) Second Office Action Appn 201410381380.8 with English Tran.

* cited by examiner

CONDUCTIVE THIN FILM, TOUCH PANEL AND METHOD FOR MANUFACTURING THE SAME, AND DISPLAY DEVICE

The application is a U.S. National Phase Entry of International Application No. PCT/CN2014/089452 filed on Oct. 24, 2014, designating the United States of America and claiming priority to Chinese Patent Application No. 201410381380.8 filed on Aug. 5, 2014. The present application claims priority to and the benefit of the above-identified applications and the above-identified applications are incorporated by reference herein in their entirety.

TECHNICAL FIELD

Embodiments of the present invention relate to a conductive thin film, a touch panel and a method for manufacturing the same, and a display device.

BACKGROUND

Touch screens, also known as "touch control screens", are the easiest, most convenient and natural Human-Computer interaction manner at present. It gives multimedia a brand new look, and becomes a very attractive new multimedia interaction device.

A touch screen comprises a touch panel and a display panel. The touch panel and the display panel are formed individually, and then integrated on a LCD (Liquid Crystal Display) panel to form a LCD touch screen. A touch panel can also be integrated on an OLED (Organic Light-Emitting Diode) display panel to form an OLED touch screen.

SUMMARY

Embodiments of the disclosure provide a conductive thin film, a touch panel, and a method for manufacturing the same, and a display device.

An embodiment of the disclosure provides a conductive thin film, materials for forming the conductive thin film comprises topological insulator, and the conductive thin film has a two-dimensional nanostructure.

An embodiment of the disclosure provides a touch panel, comprising a substrate, and a driving electrode and an induction electrode formed above substrate and insulated from each other, wherein the driving electrode and the induction electrode are adhered to substrate through an adhesive layer, and the driving electrode and/or the induction electrode are formed by the conductive thin film according to the embodiments of the disclosure.

An embodiment of the disclosure provides a method for manufacturing the touch screen, comprising:

forming a driving electrode pattern and/or an induction electrode pattern with a two-dimensional nanostructure from a topological insulator;

forming a first adhesive layer, so as to adhere the driving electrode pattern to a driving electrode region on the substrate; and forming a second adhesive layer, so as to adhere the induction electrode pattern to an induction electrode region on the substrate, wherein the driving electrode pattern and the induction electrode pattern are insulated from each other.

An embodiment of the disclosure provides a display device, comprising a display panel, and the touch panel according to the embodiments of the disclosure.

BRIEF DESCRIPTION OF THE DRAWINGS

Embodiments of the disclosure will be described in detail in connection with the figures, so as to make the present disclosure more clearly to one having ordinary skill in the art, wherein.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise defined, technical terms or scientific terms as used herein should be construed as having general meanings which should be understood by those ordinary skilled in the art. Terms of "first", "second" and the like used in the description and the claims of the present application are not intended to indicate sequences, amounts or degree of importance, but are only for purpose of distinguishing various components. Likewise, terms of "one", "a" and "the" are not intended to limit the number, but indicate that there is at least one item. Words of "including" or "comprising" and the like mean that an element or an article before them contains an element/elements or an article/articles listed thereafter, while not excluding other elements or articles. Terms of "upper", "lower" and etc. are only intended to indicate relative positional relationship which may be correspondingly changed after an absolute position of the described object is changed.

Figure 1:
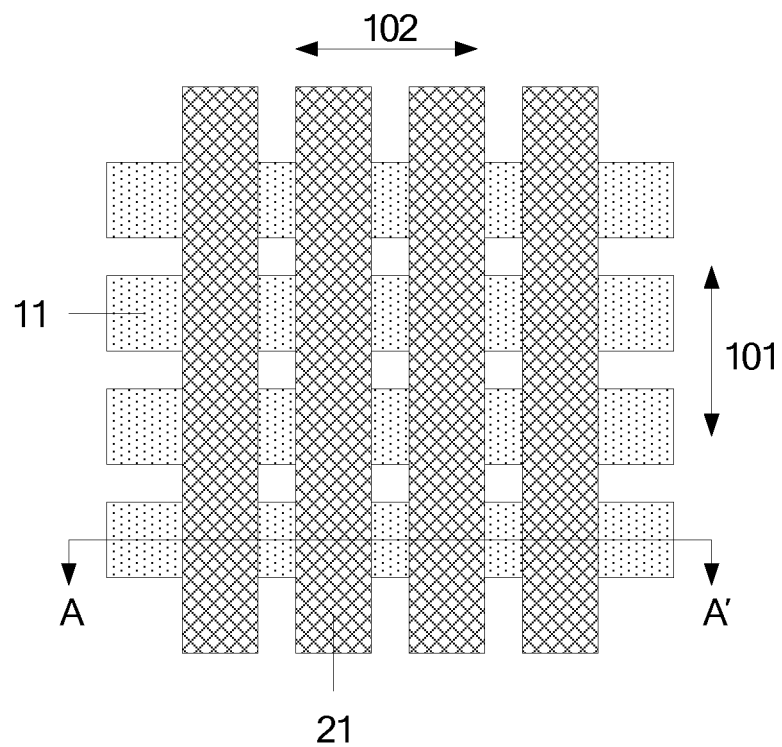
FIG. 1 is a schematic view of a driving electrode and an induction electrodes of a touch screen.
Figure 2:
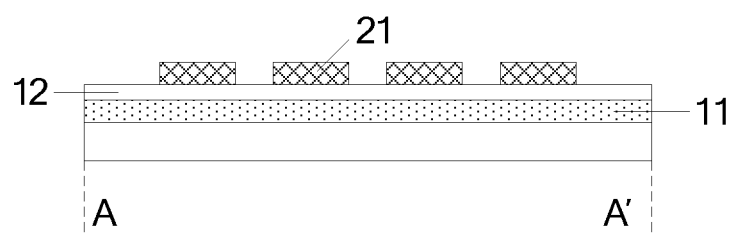
FIG. 2 is a schematic cross-sectional view of a touch panel.
Figure 3:
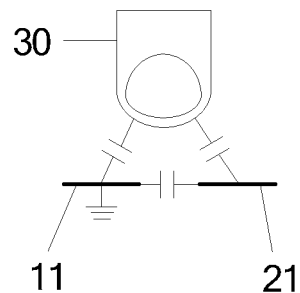
FIG. 3 is a schematic view of the touch principle of a capacitive touch panel.

Typical touch screens are of resistive and of capacitive. As shown in FIG. 1, a touch panel comprises a plurality of drive electrodes 11 disposed along the first direction 101, and a plurality of induction electrodes 21 disposed along the second direction 102. As shown in FIG. 2, an insulating layer 12 is disposed between the driving electrode 11 and the induction electrode 21, to insulate the driving electrode 11 and the induction electrode 21. As shown in FIG. 3, taking an illustration of capacitive touch panel as an example, when a finger 30 touches the screen, the capacitance produced between the driving electrode 11 and induction electrode 21 will change accordingly, then the touch position can be detected, thus realizing touch function.

It is recognized by the inventors that, the driving electrode and the induction electrode of a touch screen are generally formed by transparent conductive oxide (TOC), for instance, the driving electrode and the induction electrode are formed by ITO (Indium tin oxide). The resistance of an ITO thin film is relatively high, thus slows down the touch screen's response speed, and easily heats up the screen and increases power consumption.

An embodiment of the disclosure provides a conductive thin film with a two-dimensional nanostructure from a material comprising topological insulator.

Topological insulator is a new material formation recently cognized. Same as ordinary insulators, the energy band structure of topological insulator has a definite energy gap at Fermi energy. It, however, has Dirac (Dirac) type spin non degenerate edge state of conduction, without energy gap, at its boundary or surface. This is the most unique character that distinguishes it from ordinary insulators. The conductive edge state is stable, information can be transmitted through electronic spin, rather than through charges in traditional materials. Therefore, a topological insulator has better conductivity while with no dissipation and no heat generated.

Materials for forming conductive thin film comprise topological insulator, and the conductive thin film has a two-dimensional structure. That is, the conductive thin film is a topological insulator with a two-dimensional nanostructure, which means a nano-sized film formed by topological insulator. The conductive thin film can be two-dimensional nano film, two-dimensional nano sheet, two-dimensional nano belt, and so on that formed by topological insulators. Topological insulator with a two-dimensional nanostructure has extra high specific surface area and adjustable energy band structure. It significantly reduces the proportion of body carriers, highlights the topological surface states, and thus generates better conductivity.

It should be noted that, topological insulator with a two-dimensional nanostructure has high flexibility due to its similarity with graphene in structure, together with its unperceivable high transmittance, making it more suitable for display devices.

An embodiment of the disclosure provides a conductive thin film, the conductive thin film is made of topological insulator and has a two-dimensional nanostructure. This conductive thin film has excellent conductivity, and will not generate heat after long time conduction.

Figure 4:
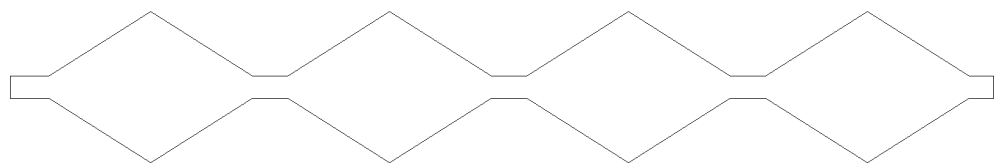
FIG. 4 is a schematic view a two-dimensional diamond structure of the conductive thin film according to an embodiment of the disclosure.

For instance, conductive thin film can be a two-dimensional stripped nanostructure, or a two-dimensional diamond nanostructure. The two-dimensional diamond nanostructure is illustrated in FIG. 4. The conductive thin film can also be a two-dimensional meshed nanostructure. The two-dimensional meshed nanostructure has a plurality of mesh arranged in array. For example, the mesh can have a shape of diamond, hexagonal or regular tetragon.

Optionally, topological insulators include at least one of HgTe, $Bi_xSb_{1-x}$, $Sb_2Te_3$, $Bi_2Te_3$, $Bi_2Se_3$, $T_1BiTe_2$, $T_1BiSe_2$, $Ge_1Bi_4Te_7$, $Ge_2Bi_2Te_5$, $Ge_1Bi_2Te_4$, AmN, PuTe, stanene (a single layer of Tin) and variant material of stanene.

$Ge_1Bi_4Te_7$, $Ge_2Bi_2Te_5$, and $Ge_1Bi_2Te_4$ belong to chalcogenides. AmN and PuTe belong to topological insulators that have strong interaction. Certainly, topological insulators can also be other materials like Ternary Heusler compounds.

Topological insulators include at least one of HgTe, $Bi_xSb_{1-x}$, $Sb_2Te_3$, $Bi_2Te_{3c}$, $Bi_2Se_3$, $T_1BiTe_2$, $T_1BiSe_2$, $Ge_1Bi_4Te_7$, $Ge_2Bi_2Te_5$, $Ge_1Bi_2Te_4$, AmN, PuTe, stanene and variant material of stanene. That is, topological insulators can be either of HgTe, $Bi_xSb_{1-x}$, $Sb_2Te_3$, $Bi_2Te_3$, $Bi_2Se_3$, $T_1BiTe_2$, $T_1BiSe_2$, $Ge_1Bi_4Te_7$, $Ge_2Bi_2Te_5$, $Ge_1Bi_2Te_4$, AmN, PuTe, stanene, or a variant material of stanene. Topological insulators can also be a mixture of two or more of above materials, for example, topological insulators can be a mixture of two of above, or a mixture of three, four, or five of above, and so forth. When topological insulators are mixture of at least two materials, selecting materials with complementary characters can enhance overall performance of the mixture.

For example, a topological insulator is formed by stanene or its variant material. Stanene is a two-dimensional material with a thickness of only one tin atom. The thickness of an atomic layer level enables the material a good light transmittance. Similar to graphene, a topological insulator formed by stanene have good flexibility and high light transmittance.

Conductivity of stanene can reach nearly 100% at room temperature, which can makes it a super conductor material. Variant material of stanene is formed by surface modification or magnetic doping of a stanene. Surface modification of stanene can be done through adding —F, —Cl, —Br, —I, —OH, and other functional groups to stanene so as to modify its character.

Furthermore, for example, a variant material of stanene is Tin fluorine compounds finally formed by adding F atom to a stanene through surface modification. When F atom is added to stanene's atom structure, stanene's conductivity can still kept at 100% when temperature reaches as high as 100° C., while property of the material maintains stable.

An embodiment of the disclosure provides a touch panel, comprising a substrate, and a driving electrode and an induction electrode formed on above substrate and insulated from each other, wherein the driving electrode and the induction electrode are adhered to substrate through adhesive layers. The driving electrode and/or the induction electrode are formed by conductive thin film according to the embodiments of the disclosure.

It should be noted that, when a driving signal (Tx) is applied to the driving electrode, an inductive signal (Rx) is received by the induction electrode. It is determined that a finger touch on the touch panel occurs through calculating change of the capacitance of the capacitor formed by the induction electrode and the driving electrode before and after the finger touch by means of the capacitive touch screen, eventually realizing touch control function.

It should be noted that, the driving electrode and the induction electrode are insulated from each other. The driving electrode and the induction electrode can be disposed at the same layer, with the driving electrode disconnected at the corresponding position of the induction electrode; or otherwise disposed at different layers and an insulating layer is formed between the driving electrode and the induction electrode. An embodiment of the disclosure is described in further details by taking the example that an insulating layer is disposed between the driving electrode and the induction electrode so as to make them insulated from each other.

The driving electrode and/or the induction electrode are topological insulators and have a two-dimensional nanostructure, that is, either the induction electrode is a topological insulator and has a two-dimensional nanostructure only, the driving electrode is a topological insulator and has a two-dimensional nanostructure only, or both the driving electrode and the induction electrodes are topological insulators and have two-dimensional nanostructure. An embodiment of the disclosure is described in further details by taking the example that both the driving electrode and the induction electrode are topological insulator and have two-dimensional nanostructures.

Figure 5:
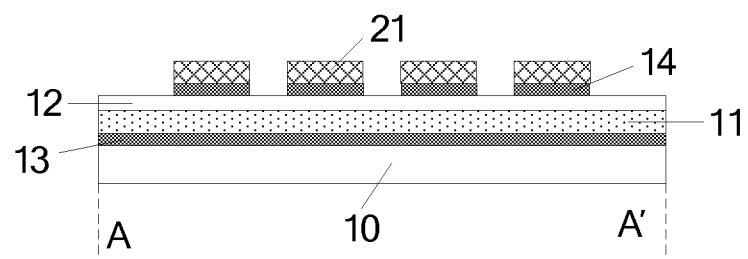
FIG. 5 is a schematic view of a touch panel according to an embodiment of the disclosure.

As illustrated in FIG. 5, the touch panel comprises a substrate 10, and a driving electrode 11 and an induction electrode 21 formed above substrate 10 and insulated from each other, wherein the driving electrode 21 and the induction electrode 22 are topological insulators and have two-dimensional nanostructures. The driving electrode 11 is adhered to the substrate 10 through the first adhesive layer 13; the induction electrode 21 is adhered to a film (insulator 12) on the substrate through the second adhesive layer 14, wherein the driving electrode 11 and the induction electrode 21 are insulated through insulator 12. The driving electrode 11 and/or the induction electrode 21 are topological insulators and have two-dimensional nanostructures. The driving electrode, and/or the induction electrode according to the embodiment of the disclosure are topological insulators and have two-dimensional nanostructures, largely reduce resistance with respect to electrodes formed by ITO or metal, and hence increase the response speed of touch control. In addition, electrodes formed by topological insulator and having a two-dimensional nanostructure will not generate heat after long time operation, this can not only reduce power dissipation, but also avoid affecting performance of other components caused by high temperature.

Optionally, the touch panel further comprises an insulating layer with adhesive function, the insulating layer with adhesive function is disposed between the driving electrode and the induction electrode, to insulate the driving electrode and the induction electrode. Moreover, the electrode on the insulator is adhered to the substrate through the insulating layer.

"Upper", "under" quoted in the embodiments of the disclosure, are subject to the priority of forming films or layer structures. For example, upper patterns are referred to patterns formed later, and under patterns are referred to patterns formed earlier.

Figure 6:
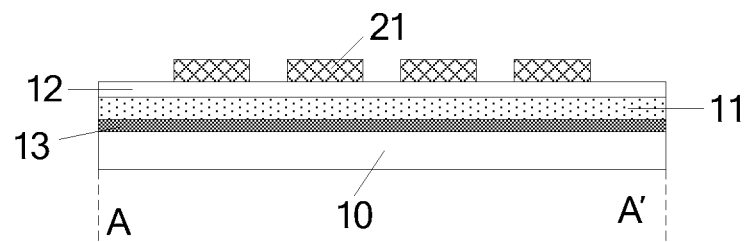
FIG. 6 is a schematic view of another touch panel according to an embodiment of the disclosure.

As illustrated in FIG. 6, an insulator 12 has adhesive function, so that the induction electrode 21 can be adhered to the insulator 12 and insulated from the driving electrode. This indicates that the induction electrode is not required to be adhered to the substrate through the second adhesive layer any more.

It should be noted that, although the embodiments of the disclosure are described by taking the manners illustrated in the figures as example, the touch panel includes a driving electrode and an induction electrode, and there are many other manners that the driving electrode and the induction electrode are formed on the substrate. So, the present disclosure is not limited to the illustrated embodiments.

An embodiment of the disclosure also provides a display device, comprising a display panel and the touch panel provided by the embodiments of the disclosure. The display device can be a liquid crystal display, e-paper, an OLED (Organic Light-Emitting Diode) display, and any other display device, as well as TV, digital camera, cell phone, tablet PC and any other product or component with display and touch function.

Optionally, a third adhesive layer is included between the display panel and the touch panel. The display panel and the touch panel are adhered together through the third adhesive layer. The third adhesive layer can be a double-sided tape and so on.

Figure 7:
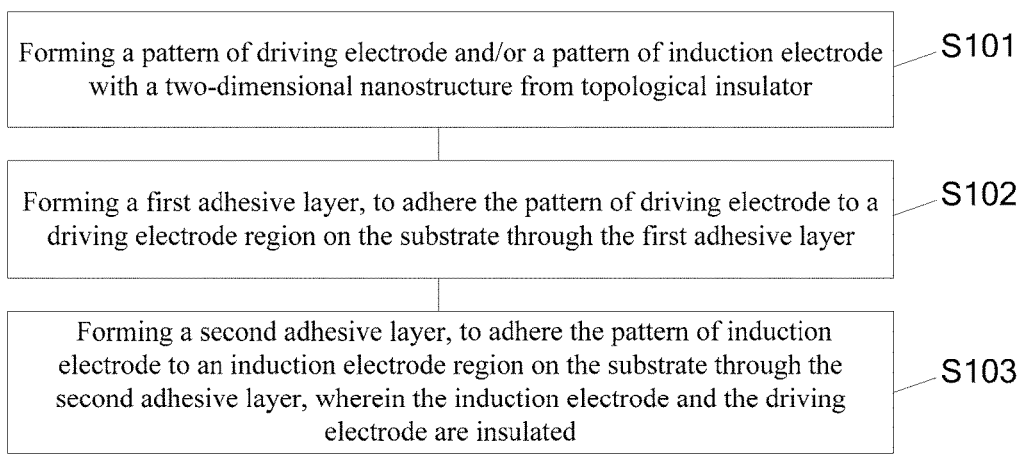
FIG. 7 is a schematic view of a manufacturing method for the touch panel according to an embodiment of the disclosure.

An embodiment of the disclosure provides a manufacturing method for touch panel, as illustrated in FIG. 7, the manufacturing method comprising:

Step 101, forming a pattern of driving electrode and/or a pattern of induction electrode with a two-dimensional nanostructure from topological insulator.

If only the driving electrode of OLED display device is topological insulator and has a two-dimensional nanostructure, a topological insulator is only needed to form a pattern of driving electrode with a two-dimensional nanostructure. If only the induction electrode of an OLED display device is a topological insulator and has a two-dimensional nanostructure, a topological insulator is only needed to form a pattern of induction electrode with a two-dimensional nanostructure. If both the driving electrode and induction electrode are topological insulators and have two-dimensional nanostructures, topological insulator is used to form the pattern of the driving electrode and the pattern of the induction electrode with a two-dimensional nanostructure.

Figure 8:
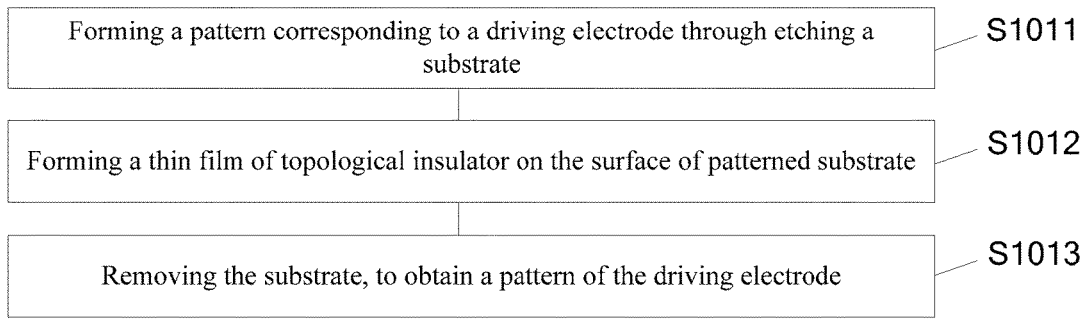
FIG. 8 is a schematic view of a manufacturing method for forming an electrode pattern with a two-dimensional nanostructure from topological insulator according to an embodiment of the disclosure.

Take an example of using topological insulators to form a pattern of driving electrode with a two-dimensional nanostructure, step 101 of the manufacturing method is further explained as following, as illustrated in FIG. 8, comprising:

Step 1011, forming a pattern corresponding to a driving electrode through etching a substrate.

The substrate can be a mica substrate, a $SrTiO_3$ (111) substrate, or other substrates on which that a thin film of topological insulator can be grown on the surface through molecular beam epitaxy (MBE). The embodiment of the disclosure is described in detail by taking a Mica substrate as an example.

To form a pattern corresponding to the driving electrode through etching the substrate, a mask with a pattern same as the pattern of the driving electrode can be used, to perform plasma etching on the mica substrate under the mask, so as to obtain the mica substrate with a pattern same as the pattern of the driving electrode.

Step 1012, forming a thin film of topological insulator on the surface of patterned substrate.

On the surface of patterned mica substrate, $Bi_2Se_3$ film is grown through molecular beam epitaxy. Thin films of other topological insulators can also be grown. The embodiment of the disclosure is described in detail by taking $Bi_2Se_3$ topological insulator as an example. And optionally, thin film of topological insulator with a two-dimensional nanostructure is formed on the patterned substrate.

Step 1013, removing the substrate, to obtain a pattern of the driving electrode.

Dissolving away the mica substrate to obtain the pattern of driving electrode of topological insulator with a two-dimensional nanostructure.

Foregoing takes the forming of the pattern of driving electrode of topological insulator with a two-dimensional nanostructure as illustration. Forming the pattern of induction electrode of topological insulator with a two-dimensional nanostructure can take it as reference, and will not be repeated in the embodiment of the disclosure.

Step 102, forming a first adhesive layer, to adhere the pattern of driving electrode to a driving electrode region on the substrate through the first adhesive layer.

Forming a first adhesive layer comprises: forming a first adhesive layer on a side surface of the driving electrode. Adhering the pattern of driving electrode to the driving electrode region on the substrate through the first adhesive layer comprises: adhering the pattern of driving electrode patterns with the first adhesive layer to the driving electrode region on the substrate.

Otherwise, forming a first adhesive layer comprises: forming a first adhesive layer on the driving electrode region of the substrate. Adhering the pattern of driving electrode to the driving electrode region on the substrate through the first adhesive layer comprises: adhering the pattern of driving electrode to the first adhesive layer.

Step 103, forming a second adhesive layer, to adhere the pattern of induction electrode to an induction electrode region on the substrate through the second adhesive layer, wherein the induction electrode and the driving electrode are insulated.

Forming a second adhesive layer comprises: forming a second adhesive layer on a side surface of the induction electrode. Adhering the pattern of induction electrode to an induction electrode region on the substrate through the second adhesive layer comprises: adhering the induction electrode patterns with the second adhesive layer to the induction electrode region on the substrate.

Otherwise, forming a second adhesive layer comprises: forming a second adhesive layer on the induction electrode region of the substrate. Adhering the pattern of induction electrode to the induction electrode region to the substrate through the second adhesive layer comprises: adhering the pattern of induction electrode to the second adhesive layer.

Figure 9:
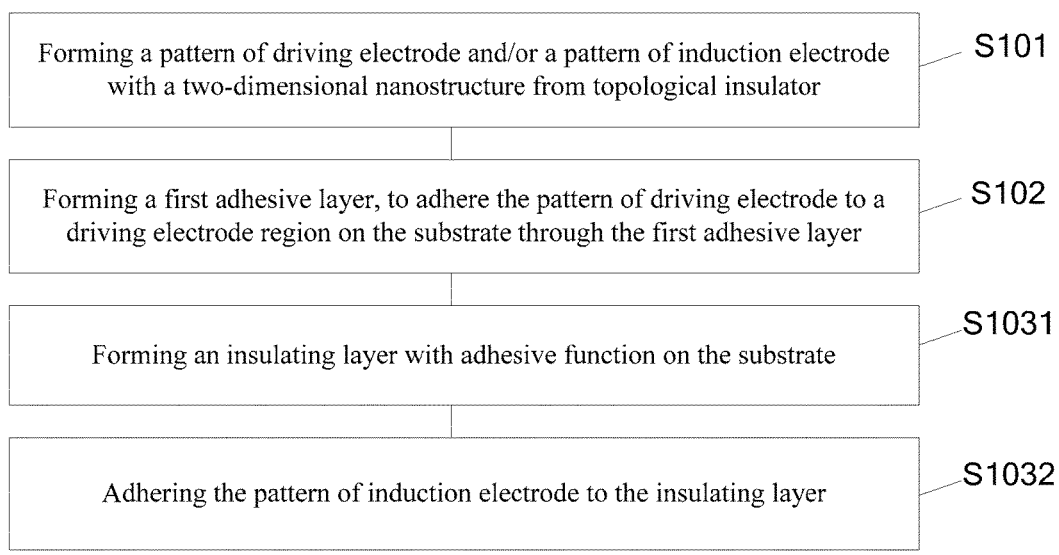
FIG. 9 is a schematic view of another manufacturing method of touch screen according to another embodiment of the disclosure.

As illustrated in FIG. 9, the step 103 comprises:

Step 1031, forming an insulating layer with adhesive function on the substrate.

After adhering the driving electrode to the substrate, form an insulating layer with adhesive function on the substrate, then the insulating layer is adhered to the driving electrode.

Step 1032, adhering the pattern of induction electrode to the insulating layer.

The insulating layer is configured to insulate the driving electrode and the induction electrode as well as adhere the induction electrode.

The embodiments of the disclosure provide a conductive thin film, a touch panel and a manufacturing method for the same, and a display device. The conductive thin film is topological insulator with a two-dimensional nanostructure. The conductive thin film has excellent conductivity, and will not generate heat after long time conduction. Using this conductive thin film to a driving electrode and an induction electrode on a touch panel, will result in great reduction of the resistance of the driving electrode and/or the induction electrode, improvement of the response speed of touch and control, decreasing of power dissipation, as well as avoiding performance of other components being affected by high temperature.

It is understood that, the foregoing are merely exemplary embodiments of the disclosure, but are not used to limit the protection scope of the disclosure. Those skilled in the art can carry out various variations and modifications, without departing from the spirit and gist of the disclosure. These variations and modifications should also fall into the protection scope of the disclosure.

The present disclosure claims priority of Chinese Patent Application No. 201410381380.8, titled "conductive thin film, touch panel and manufacturing method for the same, display device", filed on Aug. 5, 2014, the disclosure of which is hereby entirely incorporated by reference.

The invention claimed is:

1. A conductive thin film, wherein material of the conductive thin film comprises topological insulator, and the conductive thin film has a two-dimensional nanostructure and the conductive thin film is configured to be conductive at its boundary or surface and to be nonconductive inside; and wherein the conductive thin film has a two-dimensional diamond meshed nanostructure, the two-dimensional diamond meshed nanostructure has a plurality of meshes arranged in array, and the mesh has a shape of diamond.

2. The conductive thin film according to claim 1, wherein the topological insulator comprises at least one of HgTe, $Bi_xSb_{1-x}$, $Sb_2Te_3$, $Bi_2Te_3$, $Bi_2Se_3$, $T_1BiTe_2$, $T_1BiSe_2$, $Ge_1Bi_4Te_7$, $Ge_2Bi_2Te_5$, $Ge_1Bi_2Te_4$, AmN, PuTe, stanene and a variant material of stanene.

3. The conductive thin film according to claim 2, wherein the variant material of stanene is formed by performing surface modification or magnetic doping on a stanene.

4. The conductive thin film according to claim 3, wherein the variant material of stanene is Tin Fluorine compound that formed by performing surface modification on stanene through adding Fluorine atom.

5. The conductive thin film according to claim 2, wherein the variant material of stanene is Tin Fluorine compound that formed by performing surface modification on stanene through adding Fluorine atom.

6. A touch panel, comprising a substrate, insulating a driving electrode and an induction electrode formed on the substrate and insulated from each other, wherein the driving electrode and the induction electrode are adhered to the substrate through an adhesive layer; and the driving electrode and/or the induction electrode are formed by the conductive thin film according to claim 1.

7. The touch panel according to claim 6, further comprising an insulating layer with adhesive function, wherein the insulating layer with adhesive function is disposed between the driving electrode and the induction electrode, and configured to insulate the driving electrode from the induction electrode, and the electrode on the insulating layer is adhered to the substrate through the insulating layer.

8. A display device, comprising a display panel and a touch panel according to claim 7.

9. A display device, comprising a display panel and a touch panel according to claim 6.

10. The display device according to claim 9, wherein the display device further comprises a third adhesive layer disposed between the display panel and the touch panel, and the display panel and the touch panel are adhered together through the third adhesive layer.

11. A touch panel, comprising a substrate, a driving electrode and an induction electrode formed on the substrate and insulated from each other, wherein the driving electrode and the induction electrode are adhered to the substrate through an adhesive layer; and the driving electrode and/or the induction electrode are formed by the conductive thin film according to claim 1.

12. A manufacturing method for a touch panel, comprising:

forming a pattern of a driving electrode and/or a pattern of an induction electrode of topological insulator with a two-dimensional nanostructure, the driving electrode and/or the induction electrode being configured to be conductive at its boundary or surface and to be nonconductive inside;

forming a first adhesive layer, to adhere the pattern of the driving electrode to a driving electrode region on a substrate through the first adhesive layer;

forming a second adhesive layer, to adhere the pattern of induction electrode to an induction electrode region on the substrate through the second adhesive layer, wherein the pattern of induction electrode and the pattern of driving electrode are insulated from each other;

wherein the pattern of the driving electrode and/or the pattern of the induction electrode have a two-dimensional diamond meshed nanostructure, the two-dimensional diamond meshed nanostructure has a plurality of meshes arranged in array, and the mesh has a shape of diamond.

13. The manufacturing method according to claim 12, wherein forming the second adhesive layer comprises:
   forming an insulating layer with adhesive function on the substrate.

14. The manufacturing method according to claim 13, wherein forming a pattern of a driving electrode and/or a pattern of an induction electrode of topological insulator with a two-dimensional nanostructure comprises:
   performing patterned etching on the substrate, to form patterns corresponding to the driving electrode or the induction electrode;
   forming a thin film of topological insulator with a two-dimensional nanostructure on the surface of the patterned substrate; and
   removing the substrate to obtain a pattern of the driving electrode or a pattern of the induction electrode.

15. The manufacturing method according to claim 12, wherein forming a pattern of a driving electrode and/or a pattern of an induction electrode of topological insulator with a two-dimensional nanostructure comprises:
   performing patterned etching on the substrate, to form patterns corresponding to the driving electrode or the induction electrode;
   forming a thin film of topological insulator with a two-dimensional nanostructure on the surface of the patterned substrate; and
   removing the substrate to obtain a pattern of the driving electrode or a pattern of the induction electrode.

\* \* \* \* \*